United States Patent [19]
Vink et al.

[11] Patent Number: 5,981,389
[45] Date of Patent: Nov. 9, 1999

[54] METHOD FOR PRODUCING A DEVICE HAVING A CHROMIUM LAYER

[75] Inventors: Teunis J. Vink; Willem Walrave, both of Eindhoven, Netherlands

[73] Assignee: U.S. Philips Corporation, New York, N.Y.

[21] Appl. No.: 08/977,949

[22] Filed: Nov. 25, 1997

Related U.S. Application Data

[62] Division of application No. 08/601,407, Feb. 14, 1996, Pat. No. 5,751,016.

[30] Foreign Application Priority Data

Feb. 16, 1995 [EP] European Pat. Off. .............. 95200372

[51] Int. Cl.$^6$ .................................................... H01L 21/44
[52] U.S. Cl. .......................... 438/685; 438/653; 438/656; 438/660
[58] Field of Search ..................................... 438/685, 485, 438/64, 57, 4, 653, 656, 660, 952

[56] References Cited

U.S. PATENT DOCUMENTS

| | | | |
|---|---|---|---|
| 5,084,412 | 1/1992 | Nakasaki | 438/653 |
| 5,288,658 | 2/1994 | Ishihara | 438/485 |
| 5,656,098 | 8/1997 | Ishikawa et al. | 438/57 |
| 5,672,243 | 9/1997 | Hsia et al. | 438/952 |
| 5,709,938 | 1/1998 | Finley et al. | 428/336 |
| 5,751,016 | 5/1998 | Vink et al. | 257/50 |
| 5,883,398 | 11/1997 | Vink et al. | 257/50 |

*Primary Examiner*—Tuan H. Nguyen
*Assistant Examiner*—Reneé R. Berry
*Attorney, Agent, or Firm*—John C. Fox

[57] ABSTRACT

Chromium layers are deposited on a substrate by means of a sputter deposition process. By using neon as the working gas at pressures of less than 1 Pa, preferably in the range from 0.2 Pa to 0.5 Pa, the sputter-deposited chromium layers are substantially free of internal stress and have a density which is approximately equal to that of bulk chromium.

2 Claims, 2 Drawing Sheets

METHOD FOR PRODUCING A DEVICE HAVING A CHROMIUM LAYER

This is a division of application Ser. No. 08/601,407, filed Feb. 14, 1996 now U.S. Pat. No. 5,751,016.

BACKGROUND OF THE INVENTION

The invention relates to a device having a switch comprising a chromium layer and an adjacent semiconductor layer.

The invention also relates to a method of depositing chromium layers by means of sputtering in a working gas atmosphere comprising a group VIII element.

Chromium layers are used as a contact layer (at the bottom) of a semiconductor layer, for example an $\alpha$-SiN$_x$-H layer, in a switch in a device, for example in a device such as a LCD-device or plasma-device. The switching voltage of the switch in the device is preferably as low possible.

SUMMARY OF THE INVENTION

It is an object of the present invention to improve the switching characteristics of the switch in the device.

According to the invention, the device having a switch comprising a chromium layer and an adjacent semiconductor layer is characterized in that the fraction of voids in the chromium layer is less than 10%. Preferably, the fraction of voids in the chromium layer is less than 2%.

The interface between the chromium layer and the semiconductor layer functions as a Schottky barrier. The inventors have realized that the existence of a (thin) oxide layer at the interface between the chromium layer and the semiconductor layer is deleterious to the operation of the switch because it comprises a (diffusion) barrier to the injection of electrons from the chromium layer into the semiconductor layer.

To establish an optimal contact between the chromium layer and the semiconductor layer a flat and smooth surface of the chromium layer is required. With an increasing fraction of voids in the chromium layer the structure of the surface of the chromium layer becomes more and more rough. For example, a metal layer which during fabrication develops a strong columnar growth will have a rough surface structure. Such a rough chromium layer with a relatively high specific surface is easier oxidized and the less smooth the surface of the layer is, the thicker the (effective) thickness of the (native) oxide layer becomes. The electrons which have to be injected in the semiconductor layer (via a process of tunnelling through a Schottky barrier) are hampered by this relatively thick oxide diffusion barrier.

It is noted that in this invention by the wording switch an electronic element is meant by which a current can be controlled. With the wording void fraction $f_v$ it is meant the relative density $\rho$ of the material with respect to the bulk density $\rho_{bulk}$ of the material, i.e., $$f_v = \frac{\rho - \rho_{bulk}}{\rho_{bulk}} \times 100\%$$

Conventionally chromium layers as contact layer in switches of a device are deposited by means of a sputtering technique. The known sputtering techniques are, however, less suitable for the present purpose. The inventors have realized that the problem with oxide (barrier) layers are of a more general type.

A method for depositing chromium layers as described in the opening paragraph is known from Japanese Patent Application 5-65630. In this patent application an element of group VIII of the periodic table of elements is used as a working gas in a sputter deposition device. While the pressure of the above-mentioned working gases is controlled in the range from 15 to 25 mTorr (i.e. approximately from 2.0 to 3.3 Pa), chromium layers sputtered from a Cr target are deposited on a glass substrate. By confining the pressure of the working gas in the sputter deposition device to the above mentioned range, the resulting Cr layers are said to be dense and practically free from internal stress.

During sputtering, voids and/or molecules of the sputtering gas tend to be included in the sputter-deposited layers. This leads to porous films with a less than optimal density, i.e. a density which can be substantially lower than the bulk density. For certain applications the incorporations of gaseous impurities have a detrimental effect on the functionality of the deposited layers.

It is an object of the present invention to provide a method of sputtering Cr layers on a substrate, which layers are substantially free of internal stress and have a density which is approximately equal to that of bulk chromium.

According to the invention, the method of depositing chromium layers is characterized in that the group VIII element is neon and in that the working-gas pressure of neon during sputtering is less than 1 Pa. Preferably, the working-gas pressure of neon during sputtering lies in the range from 0.2 Pa to 0.5 Pa.

Surprisingly, it was found that using Ne in this pressure range, which is far below the pressure range in the Japanese Patent Application mentioned above, and for which pressure range according to the Japanese Patent Application a high internal stress is to be expected, Cr layers were obtained having a bulk-like density and virtually no stress.

A further advantage is that under these conditions, as compared to the known conditions, the mean free path in the sputtering gas is substantially longer, enabling an increase of the distance between the sputtering target and the substrate, which leads to an improved control of the deposition process and more homogeneous layers.

According to the invention, the device having a switch comprising a chromium layer and an adjacent semiconductor layer is characterized in that the chromium layer comprises traces of neon with a concentration of less than 0.1 at. %. In general, a concentration of neon of more than 0.005 at. % is present in the chromium layer. Concentrations of neon entrapped in a chromium layer can, for example, be measured with a (calibrated) electron microprobe.

BRIEF DESCRIPTION OF THE DRAWINGS

The present invention will now be described, by way of example, with reference to the accompanying drawings, in which.

DETAILED DESCRIPTION OF THE PREFERRED EMBODIMENTS

Figure 1:
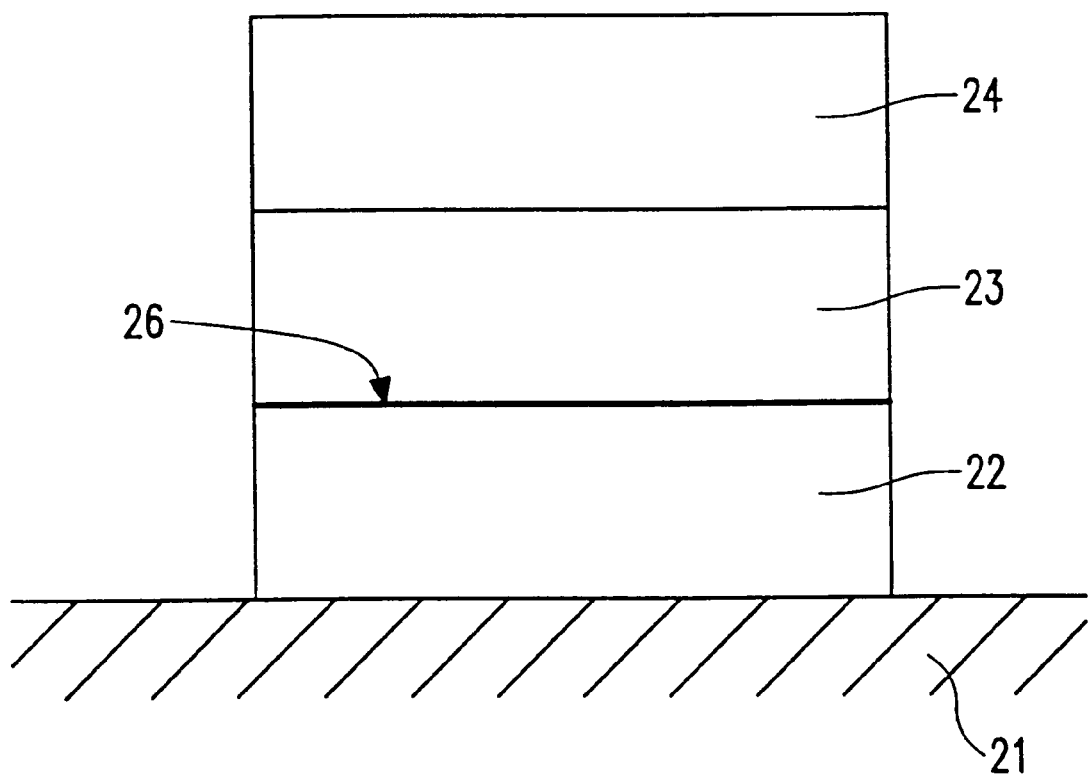
FIG. 1 shows an example of a diagrammatic cross-sectional view of a switch in a device according to the invention.

In FIG. 1 an example of a diagrammatic cross-sectional view of a switch in a device according to the invention is shown. On a substrate 21, for example made of ITO (indium tin oxide) covered glass, a first metal contact layer 22, for example of chromium, is deposited. Alternative materials for the first metal contact layer 22 are gold or aluminium. On top of the first metal contact layer 22 a semiconductor layer 23 is deposited. The semiconductor layer 23 comprises for example, amorphous silicon, poly-crystalline silicon or amorphous siliconnitride, for example $\alpha\text{-SiN}_x\text{-H}$. A second metal contact layer 24 is deposited on top of the semiconductor layer 23. Suitable materials for the metal contact layer 24 are molybdenum or any other refractory metal.

In general, an interface oxide layer 26 is present between the first metal contact layer 22 and the adjacent semiconductor layer 23. The interface between the first metal contact layer 22 and the semiconductor layer 23 as well as the interface between the semiconductor layer 23 and the adjacent second metal contact layer 22 function as Schottky barriers. The inventors have realized that the existence of a (thin) oxide layer at the interface between the first metal contact layers 22 and the semiconductor layer 23 is deleterious to the operation of the switch because it comprises a (diffusion) barrier to the injection of electrons from the first metal contact layer 22 into the semiconductor layer 23.

Figure 2:
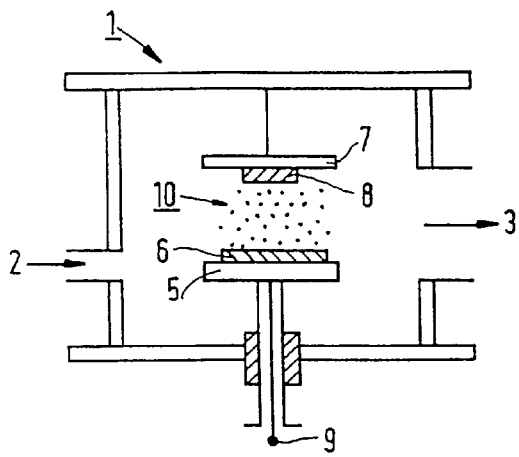
FIG. 2 shows an example of a diagrammatic cross-sectional view of a sputter deposition device.

In FIG. 2 an example of a diagrammatic cross-sectional view of a sputter-deposition device is shown. The sputtering system, preferably a magnetron sputtering device, comprises a vacuum chamber 1 which can be filled with a working gas via entrance 2, and which is connected to a vacuum system via entrance 3. The sputtering system comprises at least two electrodes 5, 7. One of the electrodes is the cold cathode 5, which is connected to a high-voltage supply via connection 9. The front surface of the cathode 5 is covered with the target material 6. The substrate(s) 8 are placed on the anode 7. A glow discharge 10 (plasma) is maintained between the electrodes 5, 7.

Figure 3:
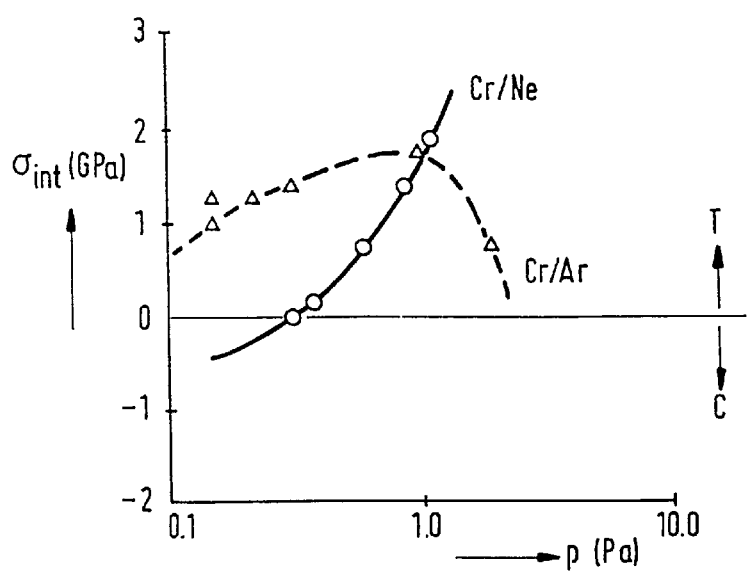
FIG. 3 shows the internal stress in Cr films sputter deposited in Ar and in Ne as a function of the working-gas pressure.

In FIG. 3 the internal stress ($\sigma_{int}$ in GPa) is shown as a function of the working-gas pressure (p in Pa) for Cr films deposited in a sputter-deposition device using Ar (Cr/Ar) or Ne (Cr/Ne) as the working gas. In general, the deposited layers are under tension (T) for positive values of the internal stress, whereas the deposited layers are under compression (C) for negative values of the internal stress. At values of the internal stress around 0 GPa, the deposited layers are practically free of internal stress. If Ar is used as the working gas in the sputter deposition device, a transition of the internal stress between tension and compression is observed at working-gas pressures in the range from 2 to 3 Pa (see FIG. 3 Cr/Ar), in accordance with the above mentioned Japanese Patent Application 5-65630. However, within the framework of the invention it has been found that Cr layers that are sputter deposited at Ar working-gas pressures under the known conditions contain many voids (up to a volume fraction of 20 to 30%) leading to a reduced density of the Cr layers. This low density is caused by the low thermal velocity of the Cr atoms close to the substrate. It is the aim of the present invention to sputter Cr layers on a substrate which are substantially free of internal stress and exhibit an increased density.

Cr films sputter deposited in an Ar atmosphere with a working-gas pressure ranging from approximately 0.1 to 2.0 Pa exhibit only tensile stress (internal stress in the range from +1 to +2 GPa). In addition, the microstructure of Cr films sputtered in Ar has relatively many voids.

In order to obtain Cr films with minimal internal stress and with bulk-like properties, a method according to the invention is characterized in that Ne is used as the working gas in the sputter deposition device and the Ne working-gas pressure is less than 1 Pa.

Japanese Patent Application 5-65630 describes in an example the use of Ar as the working gas in a sputtereposition device at a pressure ranging from 15 to 25 mTorr (i.e. approximately from 2.0 to 3.3 Pa). According to this Japanese Patent Application, the same pressure conditions should be used for other gases of group VIII of the periodic table of elements, i.e. operating the sputter-deposition device at working-gas pressures in the range from 2 to 3 Pa. While Ne is a noble gas element with a smaller atomic radius than Ar, one could select at least the same or possibly a slightly higher working-gas pressure to deposit the layers, i.e. pressures above at least 2.0 Pa but below 3.3 Pa. However, the inventors have realized that this would have an unfavourable effect on the number of voids and/or molecules of the sputtering gas incorporated in the deposited layers, which would lead to a substantially decreased density with respect to the bulk density. If, during depositing of Cr films in a sputter deposition device, the Ne working-gas pressure is selected to be less than about 1 Pa, the density of the deposited layers is or approaches that of bulk chromium and, in addition, the deposited Cr layers are practically free from internal stress. It was found that Cr layers with minimal internal stress are obtained at Ne working-gas pressures during sputtering in the range from 0.2 Pa to 0.5 Pa (see FIG. 3 Cr/Ne). In this working-gas pressure range the internal stress of Cr layers deposited in a sputter-deposition device with Ne as the working gas was in the range from –0.5 to +0.5 GPa (see the dotted lines in FIG. 3), which differs substantially from the above mentioned Japanese Patent Application in which in said pressure range the stress should exhibit a maximum.

Figure 4:
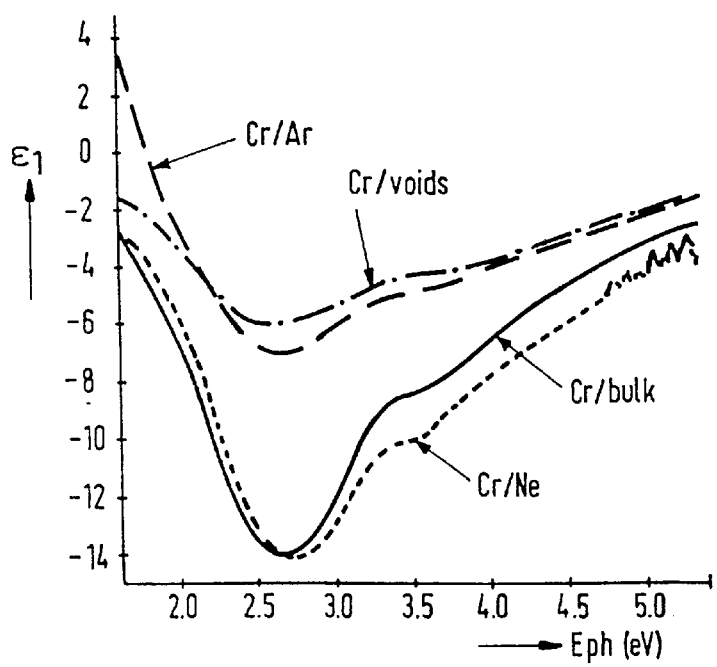
FIG. 4 shows the real part of the complex dielectric function of Cr films sputter deposited in Ar and in Ne as a function of the photon energy.

FIG. 4 shows results of measurements obtained by spectroscopic ellipsometry of bulk chromium as well as of Cr films deposited under different working-gas conditions. It is well known that measurements of the optical constants by means of spectroscopic ellipsometry are very sensitive to the microstructure and the density of the deposited layers as well as to the conditions under which the layers are deposited. In FIG. 4 the real part ($\epsilon_1$) of the complex dielectric function is plotted as a function of the photon energy ($E_{ph}$ in eV) of Cr films sputter-deposited in Ar (Cr/Ar) and in Ne (Cr/Ne). The working-gas pressure of Ar in the sputter-deposition device was 1.0 Pa whereas the working-gas pressure of Ne was 0.5 Pa. The solid line in FIG. 4 represents the real part of the complex dielectric function as a function of the photon energy of bulk Cr (Cr/bulk), as can, for example, be found in E. D. Palik: "Handbook of Optical Constants of Solids" (Academic Press Inc., New York, 1985). A great similarity is observed when comparing the results of ellipsometric measurements for bulk Cr with those for Cr films deposited under Ne working-gas conditions, which shows that the density of the Cr/Ne films is substantially bulk-like.

The results of ellipsometric measurements for Cr films deposited under Ar working-gas conditions significantly deviate from the results for bulk Cr, indicating that the density of Cr/Ar layers is substantially lower than that of bulk Cr. By means of the so-called 'Effective Medium Theory' as can be found, for example, in the article by B. T. Sullivan and R. R. Parsons: "A spectro-ellipsometric investigation of the effect of Ar partial pressure on sputtered Palladium films" (J. Vac. Sci. Technol. A5 (1987) 3399–3407) effects of structural variations on the optical constants of deposited materials can be simulated. Using this theory to simulate Cr layers containing different vacuum fractions, it was found that the incorporation of about 30% voids into a deposited Cr layer results in a curve (Cr/voids) for the real part of the complex dielectric function as a function of the photon energy, showing a considerable similarity with the curve for Cr films sputter-deposited in an Ar working-gas atmosphere, which indicates that the density of Cr layers sputter-deposited in Ar is far from bulk like. As was mentioned above, the Ar working-gas pressure used to deposit these Cr layers was 1.0 Pa, which is well below the working-gas pressure as preferred in the prior art (i.e. above at least 2.0 Pa), which shows that the density of the Cr layers as obtained in the prior art should be substantially less than that of bulk Cr.

Neon is the only element in group VIII of the periodic table of the elements that can be selected as a working gas in a sputter-deposition device employing a Cr target by which Cr layers can be made that are substantially free of internal stress and have a density which is approximately equal to that of bulk chromium.

For the chromium layers with a void fraction less than 10%, the following relation between the minimum in the real part of the complex dielectric function $\epsilon_{min}$ and the minimum in the real part of the complex dielectric function of bulk chromium $\epsilon_{min}^{bulk}$ holds:

$$|\epsilon_{min} - \epsilon_{min}^{bulk}| < 3$$

What is claimed is:

1. A method of producing chromium layers by means of a sputter deposition process in a working-gas atmosphere comprising a group VIII element, wherein the group VIII element is neon and in that the working-gas pressure of neon during sputtering is less than 1 Pa.

2. The method as mentioned in claim 1, wherein the working-gas pressure of neon during sputtering lies in the range from 0.2 Pa to 0.5 Pa.

* * * * *